US006853201B2

(12) United States Patent
Hirn et al.

(10) Patent No.: US 6,853,201 B2
(45) Date of Patent: Feb. 8, 2005

(54) METHOD FOR TESTING A CAPACITIVE ACTUATOR

(75) Inventors: Rainer Hirn, Regensburg (DE); Michael Käsbauer, Neutraubling (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/313,397

(22) Filed: Dec. 6, 2002

(65) Prior Publication Data

US 2003/0078744 A1 Apr. 24, 2003

Related U.S. Application Data

(63) Continuation of application No. PCT/DE01/02136, filed on Jun. 7, 2001.

(51) Int. Cl.[7] .......................... G01R 27/26; F02M 51/00

(52) U.S. Cl. ........................ 324/678; 324/677; 324/109; 324/532; 123/490; 123/498

(58) Field of Search ................................. 324/678, 727, 324/532, 535, 677, 109; 123/490, 498, 478; 310/316.03, 311, 317; 702/58–59, 79, 115

(56) References Cited

U.S. PATENT DOCUMENTS

| | | | | |
|---|---|---|---|---|
| 4,608,958 A | | 9/1986 | Sakakibara et al. | 123/605 |
| 6,147,433 A | * | 11/2000 | Reineke et al. | 310/316.03 |
| 6,349,705 B1 | * | 2/2002 | Pirkl et al. | 123/490 |
| 6,366,868 B2 | * | 4/2002 | Freudenberg et al. | 702/115 |
| 6,556,028 B1 | * | 4/2003 | Umanskiy et al. | 324/727 |

FOREIGN PATENT DOCUMENTS

| | | | |
|---|---|---|---|
| DE | 197 11 903 A1 | 9/1998 | F02D/41/30 |
| DE | 198 45 042 A1 | 4/2000 | G01R/31/00 |
| DE | 199 10 388 A1 | 9/2000 | H02N/2/06 |
| DE | 199 44 734 A1 | 4/2001 | H02N/2/02 |
| GB | 1 540 216 | 2/1979 | F02D/5/00 |

* cited by examiner

*Primary Examiner*—Anjan K. Deb
(74) *Attorney, Agent, or Firm*—Baker Botts L.L.P.

(57) ABSTRACT

A capacitive actuating element is driven using a control signal of duration T1. This duration T1 is related to prescribed or measured values for charging, discharging and open periods T2, T3 and T4: (T1+T3−T2−T4)≦|X| and is compared with a magnitude (limit value |X|). If a magnitude greater than |X| is obtained, then a fault is inferred.

26 Claims, 1 Drawing Sheet

METHOD FOR TESTING A CAPACITIVE ACTUATOR

CROSS REFERENCE TO RELATED APPLICATION

This application is a continuation of co-pending International Application No. PCT/DE01/02136 filed Jun. 7, 2001, which designates the United States, and claims priority to German application number DE 10028353.5 filed Jun. 8, 2000.

BACKGROUND OF THE INVENTION

The invention relates to a method for testing a capacitive actuator or actuating element, particularly an actuating element for a fuel injection valve in an internal combustion engine, for correct operation.

DE 199 10 388, which is not a prior publication and has earlier priority, describes a method for testing a piezoelectric actuating element, particularly one for a fuel injection valve, in which the actuating element's open period, ascertained from the charging and discharge currents on the actuating element by comparison with threshold values, is compared with the duration of the control signal and this comparison is used to diagnose correct operation of the actuating element. This method can be applied when the charging period and discharging period are the same length, since otherwise the actuating element's open period is not equal to the duration of the control signal.

To open, by way of example, a fuel injection valve in an internal combustion engine, an electric charge needs to be applied to the actuating element and must be removed from the actuating element again in order to close the injection valve. For a constant fuel pressure, for example in a common rail fuel injection system, the injected quantity of fuel is primarily dependent on the length of the injection period.

When any capacitive actuating element is charged, a charging current flows into the actuating element; the latter is charged when the charging current becomes zero again. During the charging operation, the actuating element voltage drop across the actuating element rises to a particular value. In the charged state, no current flows, and the actuating element voltage remains approximately constant. During discharge, a discharge current flows out of the actuating element; the latter is discharged when the discharge current becomes zero again. During the discharging operation, the actuating element voltage which is on the actuating element falls to zero volts again.

DE 198 45 042 A1 discloses a method for diagnosing a capacitive actuator, where the actuator is supplied with a prescribable amount of energy, and incorrect operating states of the actuator are inferred by comparing measured values for the actuator current, actuator voltage or actuator charge with prescribed comparative values.

DE 199 44 734, which is not a prior publication and has earlier priority, describes a method for driving a capacitive actuating element with different charging and discharging periods. The shorter the charging and discharging operations are, the more noise intensive they become.

The control operations can be disrupted by internal or external influences such that the charge applied to the actuating element remains on the actuating element for longer than prescribed by the control signals output by an engine control system, and the fuel injection valve remains open for an undefined period, which results in too much fuel being injected.

SUMMARY OF THE INVENTION

It is an object of the invention to specify a method for driving a capacitive actuating element which provides a simple way of monitoring the operation of the actuating element even for driving operations in which the charging period and discharging period are of unequal length.

The invention achieves this object by a method for testing a capacitive actuating element, particularly one for operating a fuel injection valve in an internal combustion engine, which is controlled by means of a control signal, for correct operation, wherein the controlled variables

- duration T1 of the control signal,
- actuating element's charging period T2,
- actuating element's discharging period T3, and the measured variable
- open period T4* for a valve operated by the actuating element are related to one another in accordance with the formula $(T1+T3-T2-T4^*) \leqq |X|$, where $|X|$ is a prescribed magnitude (limit value), and wherein a fault in the operation of the actuating element is diagnosed if this formula is not satisfied.

The actuating element's prescribed charging period (T2) may start when the control signal (st) starts (time t1). The actuating element's prescribed discharging period (T3) may start when the control signal (st) ends (t4), and the measured variable 'open period (T4*) for a valve operated by the actuating element' may start (t3) when the actuating element's charging current (+Ip) falls below a first current threshold value (S1) or when the actuating element voltage (Up) exceeds an upper voltage threshold value (S4), and may end (t6) when the discharge current (−Ip) exceeds a second current threshold value (S2) or when the actuating element voltage (Up) falls below the lower voltage threshold value (S3).

Another method according to the present invention for testing a capacitive actuating element, particularly one for operating a fuel injection valve in an internal combustion engine, which is controlled by means of a control signal, for correct operation, provides that the controlled variable duration T1 of the control signal and the measured variables

- actuating element's charging period T2*,
- actuating element's discharging period T3*, and
- open period T4* for a valve operated by the actuating element are related to one another in accordance with the formula $(T1+T3^*-T2^*-T4^*) \leqq |X|$, where $|X|$ is a prescribed magnitude (limit value), and in that a fault in the operation of the actuating element is diagnosed if this formula is not satisfied.

The actuating element's measured charging period (T2*) may start (t2) when the actuating element's charging current (+Ip) exceeds a first current threshold value (S1) or when the actuating element voltage (Up) exceeds a lower voltage threshold value (S3), and may end (t3) when the charging current (+Ip) falls below the first current threshold value (S1) again or when the actuating element voltage (Up) exceeds an upper voltage threshold value (S4). The actuating element's measured discharging period (T3 *) may start (t5) when the actuating element's discharge current (−Ip) falls below a second current threshold value (S2) or when the actuating element voltage (Up) falls below an upper voltage threshold value (S4), and may end (t6) when the discharge current (−Ip) exceeds the second current threshold value (S2) or when the actuating element voltage (Up) falls below the lower voltage threshold value (S3). The measured open period (T4*) for a valve operated by the actuating element may start (t3) when the actuating element's charging current (+Ip) falls below a first current threshold value (S1) or when the actuating element voltage (Up) exceeds an upper voltage threshold value (S4), and may end (t6) when the discharge current (−Ip) exceeds a second current threshold value (S2) or when the actuating element voltage (Up) falls below the lower voltage threshold value (S3). The measured variables 'charging period (T2*)' and 'discharging period (T3*)' may be compared with the corresponding, controlled variables (T2, T3), and a fault in the operation of the actuating element can be diagnosed if the measured variables differ from the controlled variables by more than a prescribed magnitude.

The methods may include that a fault occurring repeatedly on an actuating element results in this actuating element being turned off. Furthermore, a fault occurring on an actuating element can result in an entry being made in a fault log. A warning lamp may be turned on when an actuating element is turned off.

The charging current +Ip supplied to the actuating element and the discharge current −Ip dissipated by it or the actuating element voltage drop Up across the actuating element are measured and are compared with threshold values. According to the invention, prescribed or ascertained times (periods) for the control signal, charging, discharging, and actuating element operation are related to one another and are compared with a prescribed limit value. The result of the comparison is used to infer correct or faulty operation of the actuating element.

BRIEF DESCRIPTION OF THE DRAWINGS

A plurality of exemplary embodiments of the invention are described in more detail below with reference to the single figure of a schematic drawing. In the drawing.

DETAILED DESCRIPTION OF THE PREFERRED EMBODIMENTS

Figure 1:
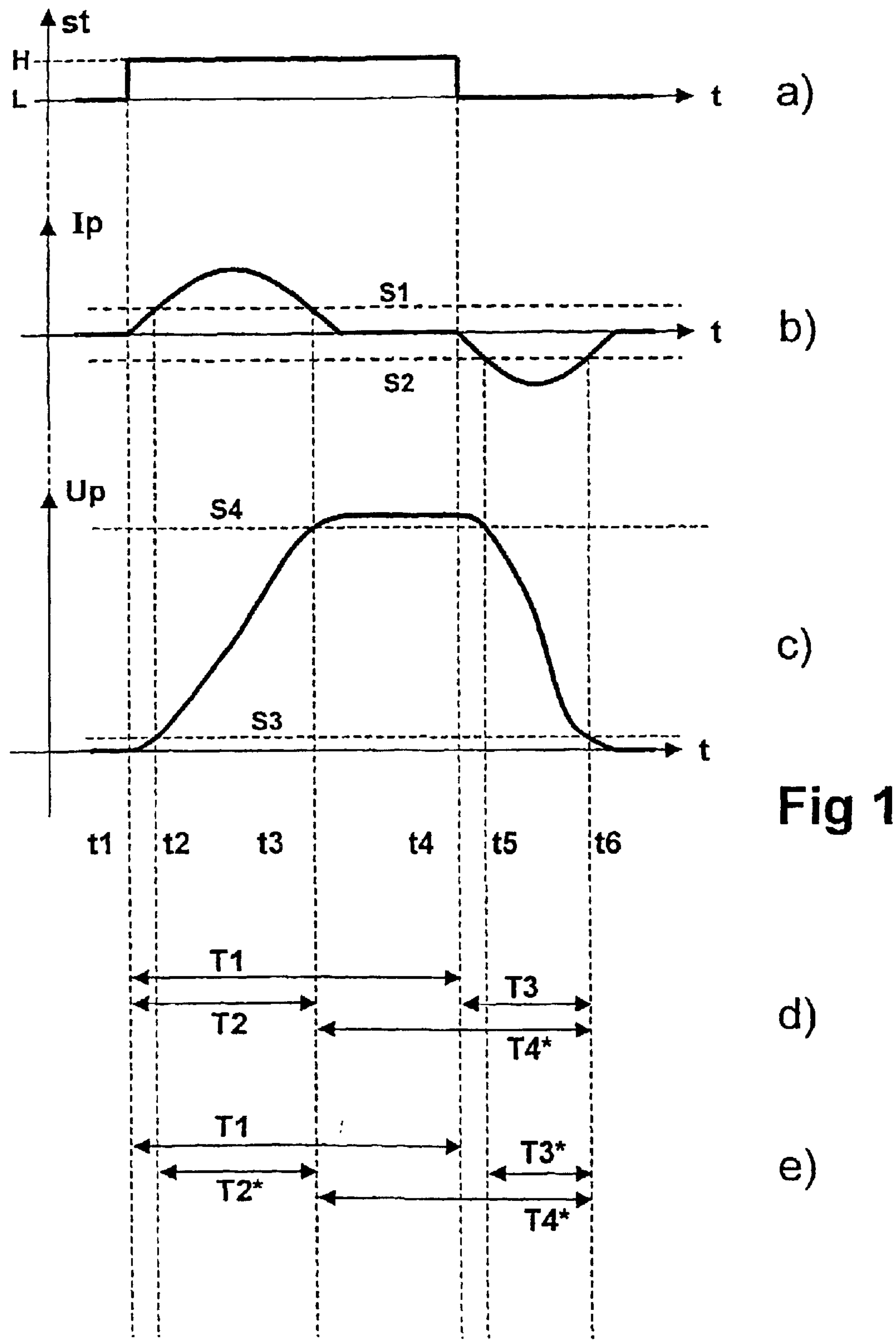
FIG. 1*a* shows the timing of a control signal st.
FIG. 1*b* shows the profile of the charging current and discharge current while an actuating element is being driven.
FIG. 1*c* shows the profile of the actuating element voltage while an actuating element is being driven.
FIG. 1*d* shows the durations of control signal, charging time, discharging time and opening time while an actuating element is being driven in a first and a third exemplary embodiment.
FIG. 1*e* shows the durations of control signal, charging time, discharging time and opening time while an actuating element is being driven in a second and a fourth exemplary embodiment.

FIG. 1*a* shows the profile of a control signal st for a capacitive actuating element (not shown) for a fuel injection valve in an internal combustion engine for a fuel injection operation. These control signals st are ascertained by an engine control unit (not shown) as the result of a plurality of input parameters, such as engine speed, load, temperature etc.

The control signal st starts at a time t1 and ends at a time t4. The difference t4−t1 is equivalent to the duration T1 of this control signal st. The drawing shows times or instants; normally, such times for the start or end of signals are output by the engine control unit, but in crankshaft angles (°KW).

In line with FIG. 1*b*, the actuating element is charged with a charging current +Ip from the time t1. This charging current +Ip exceeds a prescribed, first current threshold value S1 at the time t2, falls below it at the time t3 and then becomes zero. From the end of the control signal st at the time t4, the actuating element is discharged with a discharge current Ip−. The discharge current −Ip falls below a prescribed, second current threshold value S2 at the time t5, exceeds it again at the time t6 and then becomes zero.

FIG. 1*c* shows the actuating element voltage Up which is on the actuating element during a driving operation. This voltage rises from the start of the control signal st at the time t1, exceeds a prescribed, lower voltage threshold value S3 at the time t2 and exceeds a prescribed, upper voltage threshold value S4 at the time t3. It then reaches its maximum, which is maintained up to the end of the control signal st at the time t4. At the end of the control signal st, the actuating element voltage Up falls again, falls below the upper voltage threshold value S4 at the time t5 and falls below the lower voltage threshold value S3 at the time t6 before becoming zero again.

A first exemplary embodiment, in line with FIGS. 1*b* and 1*d*, describes a method for monitoring a capacitive actuating element using "controlled" variables of charging period T2 and discharging period T3, derived from the charging and discharge currents Ip. The text below denotes controlled variables to be variables which are measured from the start or end of the control signal st onward. In all cases, this is the variable T1 itself, and in this exemplary embodiment also the charging period T2 and the discharging period T3. All other variables, measured either after exceeding or falling below a threshold value, are called "measured" variables and have been provided with an asterisk. In this exemplary embodiment, this is just the variable T4* (the open period of the valve operated by the actuating element), since it starts when the charging current +Ip falls below the first current threshold value S1. It ends at the time t6, at which the discharge current −Ip exceeds the second current threshold value S2.

The charging period T2 extends from the start of the control signal st at the time t1 up to the time t3, at which the charging current +Ip falls below the first current threshold value S1. Accordingly, the discharging period T3 extends from the end of the control signal st at the time t4 up to the time t6, at which the discharge current −Ip exceeds the second current threshold value S2.

As can be seen in FIG. 1*d*, the following relationship applies to the variables T1 to T4* when the actuating element is in an operational state:

$$T2+T4^*=T1+T3.$$

If the sum of the periods T2+T4 does not differ from the sum of the periods T1+T3 by more than a prescribed limit value X:

$$(T2+T4^*-T1-T3)\leqq|X|,$$

it is assumed that the actuating element and hence the fuel injection valve are operating correctly. In the event of a fault occurring—for example if the discharge starts after a delay or does not start at all—the periods T3 and T4* would change by the same magnitude; the equilibrium T2+T4*=T1+T3 would be maintained and the fault would not be identified.

The charging period T2 and the discharging period T3 are also calculated and prescribed by the engine controller on the basis of various parameters, however; these variables are calculated and stored and are therefore known. This is the reason why, in this exemplary embodiment, these calculated values for the charging period T2 and the discharging period T3 are used to establish operating faults in the actuating element.

In the case of the fault described above, only the period T4* then changes, whereas the other periods T1, T2 and T3 have been prescribed; the following occurs:

$$(T2+T4^*)>(T1+T3)\rightarrow(T2+T4^*-T1-T3)>|X|.$$

In this way, the fault can now be identified.

A second exemplary embodiment, in line with FIGS. 1*b* and 1*e*, likewise describes a method for monitoring a capacitive actuating element using variables which are derived from the charging and discharge currents Ip but which are "measured" (charging period T2*, discharging period T3* and valve open period T4*).

The charging period T2* starts when the charging current +Ip exceeds the first threshold value S1, that is to say at the time t2; it ends at the time t3, when the charging current +Ip falls below the first threshold value S1 again.

The discharging period T3* starts when the discharge current −Ip falls below the second threshold value S2, that is to say at the time t5; it ends at the time t6, when the discharge current −Ip exceeds the second threshold value S2 again.

For this exemplary embodiment, and for the fourth exemplary embodiment described further below, it can be assumed that, in a first approximation, t2−t1=t5−t4.

For the fault described above, only the period T4* changes in this case too, and the fault can be identified:

$$(T2^*+T4^*)>(T1+T3^*)\rightarrow(T2^*+T4^*-T1-T3^*)>|X|.$$

A third exemplary embodiment, in line with FIGS. 1*c* and 1*d*, describes a method for monitoring a capacitive actuating element using "controlled" variables, derived from the actuating element voltage Up, of charging period T2 and discharging period T3.

The charging period T2 extends from the start of the control signal st at the time t1 up to the time t3, at which the actuating element voltage Up exceeds the upper voltage threshold value S3. Accordingly, the discharging period T3 extends from the end of the control signal st at the time t4 up to the time t6, at which the discharge current −Ip falls below the lower voltage threshold value S3 again.

The open period T4* for the valve operated by the actuating element starts when the actuating element voltage Up exceeds the upper voltage threshold value S4. It ends at the time t6, at which the actuating element voltage Up falls below the lower voltage threshold value S3 again.

In this exemplary embodiment too, the prescribed, stored values are again used for the charging and discharging periods. In the case of the fault mentioned in the first exemplary embodiment, the method in accordance with this third exemplary embodiment proceeds in exactly the same way as the method in accordance with the first exemplary embodiment.

Finally, a fourth exemplary embodiment, in line with FIGS. 1*c* and 1*e*, describes the method using variables which are derived from the actuating element voltage Up but which are "measured" (charging period T2*, discharging period T3* and valve open period T4*).

The charging period T2* extends from the time t2, at which the actuating element voltage Up exceeds the lower voltage threshold value S3, up to the time t3, at which the actuating element voltage Up exceeds the upper voltage threshold value S4. Accordingly, the discharging period T3* extends from the time t5, at which the actuating element voltage Up falls below the upper voltage threshold value S4, up to the time t6, at which the actuating element voltage Up falls below the lower voltage threshold value S3 again.

In this exemplary embodiment too, the open period T4* for the valve operated by the actuating element starts when the actuating element voltage Up exceeds the upper voltage threshold value S4, and ends at the time t6, at which the actuating element voltage Up falls below the lower voltage threshold value S3 again. In this fourth exemplary embodiment too, as in the second exemplary embodiment, only the period T4* changes for the fault described above, and the fault can be identified:

$$(T2^*+T4^*)>(T1+T3^*)\rightarrow(T2^*+T4^*-T1-T3^*)>|X|.$$

The faults which can be identified using the described method are as follows:

The first method, in line with the first or third exemplary embodiment, in which T1, T2 and T3 are "controlled" (calculated and stored) variables and T4 is measured, can be used to establish the following faults:

- the charging current +Ip or the discharge current −Ip starts to flow too early or too late;
- the charging period T2 or the discharging period T3 becomes longer or shorter than the prescribed value.

In these four cases, the prescribed values of the variables T1, T2 and T3 remain unchanged, but T4 becomes longer or shorter):

$$(T2+T4^*)>(T1+T3)\rightarrow(T2+T4^*-T1-T3)>|X|.$$

The second method, in line with the second or fourth exemplary embodiment, in which T1 is a "controlled" variable and T2*, T3* and T4* are measured, can be used to establish the following faults:

a) with a level of accuracy as in the first method:
   all faults which can be detected on the basis of the first method when the measured values T2* and T3* are additionally compared with the controlled variables T2 and T3; if there is no match, then this is rated as a fault;

b) with a better level of accuracy than in the first method:
   the charging current +Ip or the discharge current −Ip starts to flow too early or too late; in this case, the charging period T2* or the discharging period T3* remains the same length and is merely shifted forward or backward; only the variable T4* changes in this case:

$$(T2^*+T4^*)>(T1+T3^*)\rightarrow(T2^*+T4^*-T1-T3^*)>|X|.$$

It is also possible to establish a plurality of faults occurring simultaneously, but these would result in too long a list on account of the large number of combinations for them.

When one of the listed faults arises, then in the event of it arising once, for example, no reaction is triggered. If it arises a plurality of times, then this actuating element (and, in the case of an internal combustion engine, at least the associated cylinder) needs to be turned off. If there is an OBD system (On-Board Diagnosis) available, an entry is then made in a fault log, for example whenever a fault arises, and a warning lamp can additionally be turned on.

We claim:

1. A method for testing a capacitive actuating element which is controlled by means of a control signal, for correct operation, wherein the controlled variables duration T1 of the control signal, actuating element's charging period T2, actuating element's discharging period T3, and the measured variable open period T4* for a valve operated by the actuating element are related to one another in accordance with the formula (T1+T3−T2−T4*)≦|X|, where |X| is a predetermined value, and wherein a fault in the operation of the actuating element is diagnosed if this formula is not satisfied.

2. The method as in claim 1, wherein the actuating element is one for operating a fuel injection valve in an internal combustion engine.

3. The method as claimed in claim 1, wherein the actuating element's prescribed charging period T2 starts when the control signal starts.

4. The method as claimed in claim 1, wherein the actuating element's prescribed discharging period T3 starts when the control signal ends.

5. The method as claimed in claim 1, wherein the measured variable 'open period T4* for a valve operated by the actuating element starts when the actuating element's charging current falls below a first current threshold value or when the actuating element voltage exceeds an upper voltage threshold value, and ends when the discharge current exceeds a second current threshold value or when the actuating element voltage falls below the lower voltage threshold value.

6. The method as claimed in claim 1, wherein a fault occurring repeatedly on an actuating element results in this actuating element being turned off.

7. The method as claimed in claim 6, wherein a warning lamp is turned on when an actuating element is turned off.

8. The method as claimed in claim 1, wherein a fault occurring on an actuating element results in an entry being made in a fault log.

9. A method for testing a capacitive actuating element which is controlled by means of a control signal, for correct operation, wherein the controlled variable duration T1 of the control signal and the measured variables actuating element's charging period T2*, actuating element's discharging period T3*, and open period T4* for a valve operated by the actuating element are related to one another in accordance with the formula (T1+T3*−T2*−T4*)≦|X|, where |X| is a predetermined value, and wherein a fault in the operation of the actuating element is diagnosed if this formula is not satisfied.

10. The method as claimed in claim 9, wherein the actuating element's measured charging period T2* starts when the actuating element's charging current exceeds a first current threshold value and ends when the charging current falls below the first current threshold value again.

11. The method as claimed in claim 9, wherein the actuating element's measured charging period T2* starts when the actuating element voltage exceeds a lower voltage threshold value, and ends when the charging current falls below the first current threshold value again.

12. The method as claimed in claim 9, wherein the actuating element's measured charging period T2* starts when the actuating element's charging current exceeds a first current threshold value, and ends when the actuating element voltage exceeds an upper voltage threshold value.

13. The method as claimed in claim 9, wherein the actuating element's measured charging period T2* starts when the actuating element voltage exceeds a lower voltage threshold value, and ends when the actuating element voltage exceeds an upper voltage threshold value.

14. The method as claimed in claim 9, wherein the actuating element's measured discharging period starts when the actuating element's discharge current falls below a second current threshold value.

15. The method as claimed in claim 9, wherein the actuating element's measured discharging period starts when the actuating element voltage falls below an upper voltage threshold value.

16. The method as claimed in claim 9, wherein the actuating element's measured discharging period ends when the discharge current exceeds the second current threshold value.

17. The method as claimed in claim 9, wherein the actuating element's measured discharging period ends when the actuating element voltage falls below the lower voltage threshold value.

18. The method as claimed in claim 9, wherein the measured open period for a valve operated by the actuating element starts when the actuating element's charging current falls below a first current threshold value.

19. The method as claimed in claim 9, wherein the measured open period for a valve operated by the actuating element starts when the actuating element voltage exceeds an upper voltage threshold value.

20. The method as claimed in claim 9, wherein the measured open period for a valve operated by the actuating element ends when the discharge current exceeds a second current threshold value.

21. The method as claimed in claim 9, wherein the measured open period for a valve operated by the actuating element ends when the actuating element voltage falls below the lower voltage threshold value.

22. The method as claimed in claim 9, wherein the measured variables 'charging period T2*' and 'discharging period T3*' are compared with the corresponding, controlled variables T2, T3, respectively and wherein a fault in the operation of the actuating element is diagnosed if the measured variables differ from the controlled variables by more than a prescribed magnitude.

23. The method as claimed in claim 9, wherein a fault occurring repeatedly on an actuating element results in this actuating element being turned off.

24. The method as claimed in claim 23, wherein a warning lamp is turned on when an actuating element is turned off.

25. The method as claimed in claim 9, wherein a fault occurring on an actuating element results in an entry being made in a fault log.

26. The method as in claim 9, wherein the actuating element is one for operating a fuel injection valve in an internal combustion engine.

* * * * *

UNITED STATES PATENT AND TRADEMARK OFFICE

CERTIFICATE OF CORRECTION

PATENT NO. : 6,853,201 B2 Page 1 of 1
DATED : February 8, 2005
INVENTOR(S) : Rainer Hirn and Michael Käsbauer It is certified that error appears in the above-identified patent and that said Letters Patent is hereby corrected as shown below:

Title page,
After Item [65], please insert the following:
-- [30] Foreign Application Priority Data:
June 8, 2000 (DE) ..........................................100 28 353 --

Signed and Sealed this

Fifth Day of July, 2005

JON W. DUDAS
*Director of the United States Patent and Trademark Office*